United States Patent [19]
Saito et al.

[11] Patent Number: 5,440,451
[45] Date of Patent: Aug. 8, 1995

[54] MEMORY ASSEMBLY

[75] Inventors: Hirokazu Saito; Takeshi Iijima, both of Tokyo, Japan

[73] Assignee: Casio Computer Co., Ltd., Tokyo, Japan

[21] Appl. No.: 163,428

[22] Filed: Dec. 8, 1993

[30] Foreign Application Priority Data

Dec. 29, 1992 [JP]  Japan .................................. 4-360097

[51] Int. Cl.$^6$ ........................ H05K 7/02; H01L 23/28; H01L 23/02
[52] U.S. Cl. .................................. 361/760; 361/737; 174/260; 174/261; 174/52.2; 174/52.4; 257/690; 257/700; 257/787
[58] Field of Search ................... 361/760–761, 361/764–765, 768, 777, 783–784, 736–737, 792; 174/52.2, 52.4, 260, 261–262; 257/690, 700, 787

[56] References Cited

U.S. PATENT DOCUMENTS 3,436,604  4/1969  Hyltin et al. .................. 361/764
4,804,828  2/1989  Oogita .......................... 361/752

Primary Examiner—Bot L. LeDynh
Attorney, Agent, or Firm—Frishauf, Holtz, Goodman & Woodward

[57] ABSTRACT

A memory assembly, comprises a wiring board having wiring patterns, the wiring patterns having a plurality of electrodes, each of the wiring patterns having a connecting terminal formed on a single main surface of the wiring board, a memory device mounted to the wiring board and having a plurality of electrodes connected to the electrodes of the wiring patterns, and an electrical insulator mounted to the main surface of the wiring board and having a shape to expose the connecting terminal to the atmosphere. The insulator insulates the wiring patterns, the electrodes of the wiring patterns and the connecting terminal from possible electrical charges on a surface of the memory assembly to protect the memory device from being electrically charged and discharged. Even if the exterior surface of the memory assembly is charged with possible static electricity, the interior of the memory assembly is protected from being electrically charged and discharged.

13 Claims, 1 Drawing Sheet

MEMORY ASSEMBLY

BACKGROUND OF THE INVENTION

1. Field of the Invention

The present invention relates to a portable memory assembly including an IC memory for use in processing and/or storing data.

2. Description of the Related Art

Portable memory assemblies comprise a flat memory assembly, such as a card-shaped memory or a coin-shaped memory, having a structure in which one main surface of a wiring board has an IC memory chip for use in processing and/or storing data mounted thereto, and the other main surface of the wiring board has a plurality of connecting terminals connected to external terminals of a data processing device outside the memory assembly when the memory assembly receives and sends data from and to the data processing device. The connecting terminals are connected to the IC memory chip through electrically conductive through-holes in the wiring board and through wiring patterns formed on the one main surface of the wiring board.

In this memory assembly, a package of vinyl chloride covers the one main surface of the wiring board and the IC memory chip and the other main surface of the wiring board directly constitutes the exterior surface of the memory assembly so that the connecting terminals extend outside of the memory assembly. Thus, friction between the exterior surface of the memory assembly and clothes of a user of the memory assembly may charge the exterior surface of the memory assembly with static electricity, so that the IC memory chip is charged with the electricity via the connecting terminals, the conductive through-holes and the wiring patterns. When a conductor such as human body contacts part of the connecting terminals, the IC memory chip may discharge the electricity via the part of the connecting terminals, the conductive through-hole and the wiring patterns. During the discharge, a relatively high current may pass through part of wiring patterns of a metal such as aluminum in the IC memory chip to heat, melt and break the part of the wiring patterns in the IC memory chip.

SUMMARY OF THE INVENTION

The present invention was made in view of the situation described above.

An object of the present invention is to provide a memory assembly which can preclude an IC memory chip included therewithin from being charged with electricity.

In order to achieve this object, the present invention comprises a wiring board having wiring patterns, the wiring patterns having a plurality of electrodes, each of the wiring patterns having a connecting terminal which is electrically connectable to a data processing device outside the memory assembly, the connecting terminal being formed on a single main surface of the wiring board, a memory device mounted to the wiring board and having a plurality of electrodes electrically connected to the electrodes of the wiring patterns, and an electrical insulator mounted to said main surface of the wiring board and having a shape exposing the connecting terminal to the atmosphere, the insulator insulating the wiring patterns, the electrodes of the wiring patterns and the connecting terminal from possible electricity charged on a surface of the memory assembly. Ultimately, the insulator protects the memory device from being electrically charged and discharged.

Other objects, features and advantages of the present invention will be apparent from a consideration of the following description, taken in connection with the accompanying drawings.

BRIEF DESCRIPTION OF THE DRAWINGS

FIGS. 1(A) and 1(B) show a memory assembly according to an embodiment of the present invention, in which:

FIG. 1A is a plan view of the memory assembly; and

FIG. 1B is a sectional view taken along Line 1B—1B in FIG. 1A.

DETAILED DESCRIPTION OF THE PREFERRED EMBODIMENT

An embodiment of the present invention will be described with reference to the drawings hereinafter.

Figure 1A:
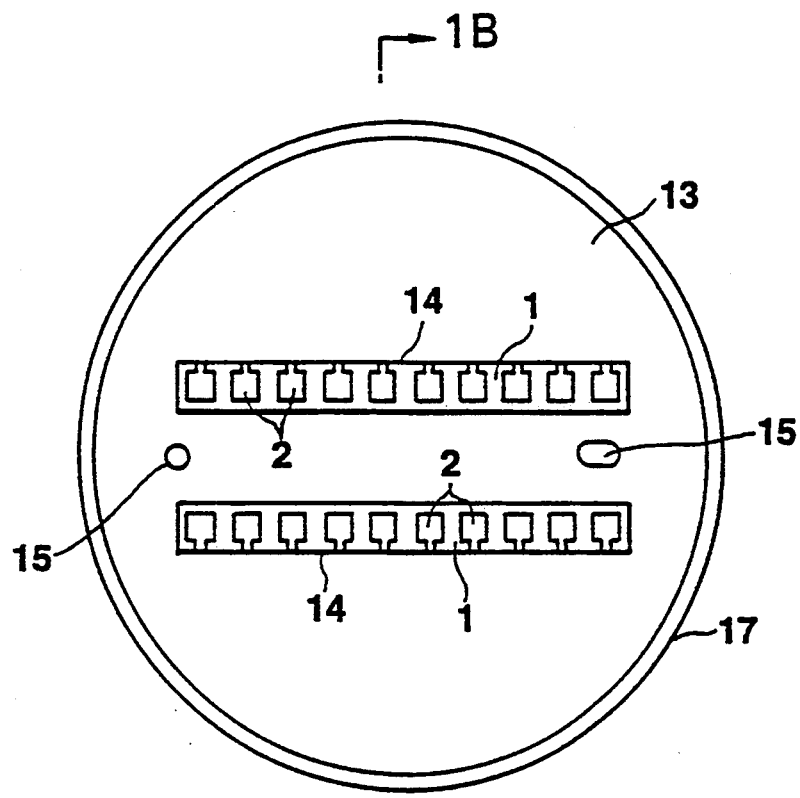
Figure 1B:
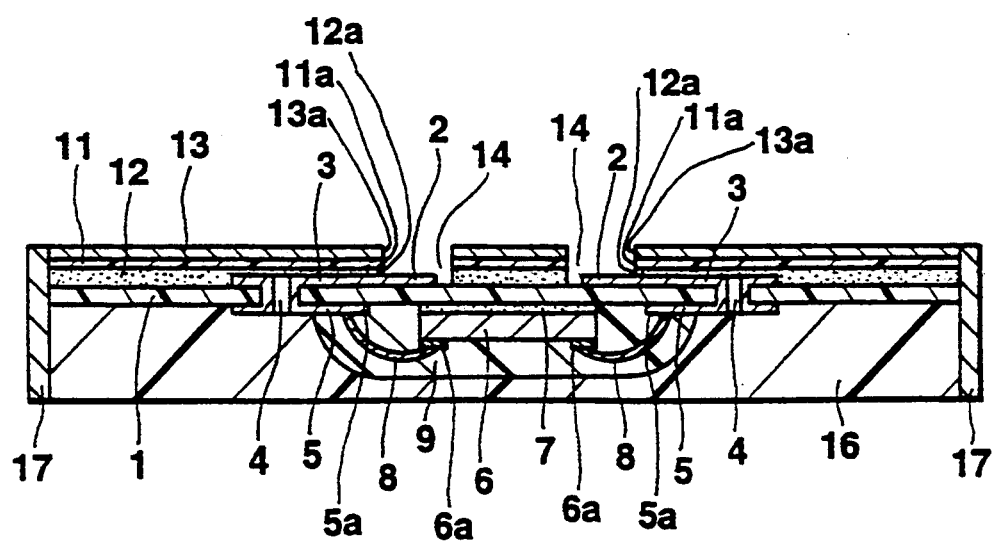

FIGS. 1(A) and 1(B) show a memory assembly according to the embodiment of the present invention. The memory assembly comprises a disc-shaped base or wiring board 1 of a glass epoxy resin, a ceramic material or the like. Two straight arrays of connecting terminals each comprising ten connecting terminals 2 are patterned on an upper surface of the base board 1 at predetermined positions in parallel to each other. Each connecting terminal 2 is electrically connected to a wiring pattern 5 formed on the underside of the base board 1 and having an electrode 5a, via a wiring pattern 3 formed on the upper surface of the base board 1 and a conductive through-hole 4 in the base board 1. A predetermined portion of the underside of the base board 1 has an IC memory chip 6 attached thereto by an adhesive 7. The IC memory chip 6 comprises a semiconductor device such as an EEPROM or a mask ROM and has electrodes 6a. The electrodes 6a of the IC memory chip 6 are electrically connected by the wire bonding to the electrodes 5a of the wiring patterns 5 via wires 8 of aluminum, gold or the like. A sealer 9 of epoxy resin or silicone resin seals an electrical connection between the IC memory chip 6, the wires 8 and the electrodes 5a of the wiring patterns 5, the IC memory chip 6, and the wires 8.

The upper surface of the base board 1 has a disc-shaped insulating board 11 of an insulating resin or the like bonded thereto by a layer of an adhesive 12. An upper surface of the insulating board 11 has a disc-shaped and electrically conductive board 13 bonded thereto. The conductive board 13 is made, e.g., of copper. An upper surface of the conductive board 13 constitutes part of the exterior surface of the memory assembly.

As shown in FIG. 1A and 1B, the conductive board 13, the insulating board 11 and the layer of adhesive 12 have predetermined slots 13a, 11a and 12a having the same shape and superposed. The slots 13a, 11a and 12a constitute a groove 14 on the base board 1. The connecting terminals 2 are arrayed so as to appear in the groove 14 and be exposed to the atmosphere. That is, the slots 11a, 12a and 13a expose the arrays of connecting terminals 2 to the atmosphere. In addition, two predetermined ports of an assembly of the conductive board 13, the insulating board 11 and the layer of adhesive 12 have two recesses 15 in the top portion of the memory assembly between the arrays of connecting terminals 2. These recesses 15 serve to align the memory assembly with a data processing device (not shown) when the memory assembly is mounted to the data processing device. The cross section of one recess 15 has the circular form and that of the other recess 15 has an ellipsoidal form extending in the direction of a line joining the recesses 15. The one recess 15 having the circular form serves as a reference for the alignment of the memory assembly with the data processing device. As seen in FIG. 1(B), a package 16 of a resin such as vinyl chloride is injection-molded and mounted to the underside of the base board 1 and the sealer 9. An annular electrically conductive framework 17 of a metal such as stainless steel is mounted on the cylindrical surface of the assembly of the base board 1, the insulating board 11, the conductive board 13 and the package 16. The annular conductive framework 17 constitutes the cylindrical surface of the memory assembly and is in contact with the conductive board 13 to form an electrical connection therebetween.

In one embodiment of the present invention, when the memory assembly has a diameter of about 22-24 mm, the thickness of an assembly of the conductive board 13 and the insulating board 11 is selected to be about 0.2 mm and the width of each groove 14 is selected to be about 1-2 mm.

In operation, even when the upper surface of the conductive board 13 is charged with possible static electricity, the atmosphere constituting an insulator in the grooves 14 precludes the static electricity from transferring to the connecting terminals 2. In addition, the conductive board 13 and the annular conductive framework 17 securely store the static electricity, so that no static electricity transfers to the connecting terminals 2. The configuration of an assembly of the conductive board 13, the insulating board 11 and the annular conductive framework 17 precludes the IC memory chip 6 from being charged with electricity and further wiring patterns within the IC memory chip 6 from being broken by heat due to a discharge of electricity from the charged IC memory chip 6.

The method of mounting the IC memory chip 6 to the base board 1 is not restricted to the wire bonding but may be the flip chip bonding. In addition, the number of IC memory chips mounted to the base board 1 is not restricted to one as in a case of mounting a single EEPROM or mask ROM. For example, this number may be two or more as in a case of mounting the two chips of an EEPROM or a mask ROM and a controller chip such as an ASIC.

The present invention is not rigidly restricted to the embodiment described above. It is to be understood that an ordinary person skilled in the art can easily change and modify the present invention without departing from the scope of the invention defined in the appended claims.

What is claimed is:

1. A memory assembly, comprising:
   a memory device having a plurality of electrodes;
   a wiring board having wiring patterns, the wiring patterns having a plurality of electrodes electrically connected to the electrodes of said memory device, each of the wiring patterns having a connecting terminal which is electrically connectable to a data processing device outside the memory assembly, the connecting terminal being formed on a single surface of said wiring board;
   an insulating board mounted to said surface of said wiring board and having an opening therein which exposes the connecting terminal to the atmosphere; and
   an electrically conductive board mounted to a surface of said insulating board opposite to a wiring board side surface of said insulating board, said electrically conductive board having an opening therein which exposes the connecting terminal to the atmosphere.

2. The memory assembly as recited in claim 1, further comprising:
   an electrically conductive framework mounted to the peripheries of said wiring board, said insulating board and said electrically conductive board.

3. The memory assembly as recited in claim 2, wherein a surface of the memory assembly has a recess for aligning the memory assembly with a data processing device when the memory assembly is mounted to the data processing device.

4. The memory assembly as recited in claim 1, wherein a surface of the memory assembly has a recess for aligning the memory assembly with a data processing device when the memory assembly is mounted to the data processing device.

5. The memory assembly as recited in claim 1, further comprising:
   a package of a resin mounted to another surface of said wiring board opposite to an insulating board side surface of said wiring board.

6. A memory assembly, comprising:
   a memory device having a plurality of electrodes;
   a wiring board having wiring patterns, the wiring patterns having a plurality of electrodes electrically connected to the electrodes of said memory device, each of the wiring patterns having a connecting terminal which is electrically connectable to a data processing device outside the memory assembly, the connecting terminal being formed on a single surface of said wiring board;
   an insulating board mounted to said surface of said wiring board and having an opening therein which exposes the connecting terminal to the atmosphere;
   an electrically conductive board mounted to a surface of said insulating board opposite to a wiring board side surface of said insulating board, said electrically conductive board having a shape exposing the connecting terminal to the atmosphere; and
   an electrically conductive framework mounted to the peripheries of said wiring board, said insulating board and said electrically conductive board.

7. The memory assembly as recited in claim 6, wherein a surface of the memory assembly has a recess for aligning the memory assembly with a data processing device when the memory assembly is mounted to the data processing device.

8. A memory assembly, comprising:
   a memory device having a plurality of electrodes;
   a wiring board having wiring patterns, the wiring patterns having a plurality of electrodes electrically connected to the electrodes of said memory device, each of the wiring patterns having a connecting terminal which is electrically connectable to a data processing device outside the memory assembly, the connecting terminal being formed on a single surface of said wiring board;
   an insulating board mounted to said surface of said wiring board and having a shape which exposes the connecting terminal to the atmosphere;

an electrically conductive board mounted to a surface of said insulating board opposite to a wiring board side surface of said insulating board, said electrically conductive board having a shape which exposes the connecting terminal to the atmosphere; and an electrically conductive framework mounted to the peripheries of said wiring board, said insulating board and said electrically conductive board.

9. The memory assembly as recited in claim 8, wherein a surface of the memory assembly has a recess for aligning the memory assembly with a data processing device when the memory assembly is mounted to the data processing device.

10. A memory assembly, comprising:

a memory device having a plurality of electrodes;

a wiring board having wiring patterns, the wiring patterns having a plurality of electrodes electrically connected to the electrodes of said memory device, each of the wiring patterns having a connecting terminal which is electrically connectable to a data processing device outside the memory assembly, the connecting terminal being formed on a single surface of said wiring board;

an insulating board mounted to said surface of said wiring board and having an opening therein which exposes the connecting terminal to the atmosphere; and an electrically conductive framework mounted to the peripheries of said wiring board and said insulating board.

11. The memory assembly as recited in claim 10, wherein a surface of the memory assembly has a recess for aligning the memory assembly with a data processing device when the memory assembly is mounted to the data processing device.

12. A memory assembly, comprising:

a memory device having a plurality of electrodes;

a wiring board having wiring patterns, the wiring patterns having a plurality of electrodes electrically connected to the electrodes of said memory device, each of the wiring patterns having a connecting terminal which is electrically connectable to a data processing device outside the memory assembly, the connecting terminal being formed on a single surface of said wiring board;

an insulating board mounted to said surface of said wiring board and having a shape which exposes the connecting terminal to the atmosphere; and an electrically conductive framework mounted to the peripheries of said wiring board and said insulating board.

13. The memory assembly as recited in claim 12, wherein a surface of the memory assembly has a recess for aligning the memory assembly with a data processing device when the memory assembly is mounted to the data processing device.

* * * * *